United States Patent

Noda et al.

[11] Patent Number: 6,011,500
[45] Date of Patent: Jan. 4, 2000

[54] INTEGRATED CIRCUIT WITH A BUILT-IN D/A CONVERTER

[75] Inventors: Hiroshi Noda; Yasushi Fujiwara, both of Tokyo, Japan

[73] Assignees: Mitsubishi Electric Engineering Co., Ltd.; Mitsubishi Denki Kabushiki Kaisha, both of Tokyo, Japan

[21] Appl. No.: 08/959,614

[22] Filed: Oct. 28, 1997

[30] Foreign Application Priority Data

Jun. 27, 1997 [JP] Japan .................................. 9-172463

[51] Int. Cl.⁷ .................................................. H03M 1/10
[52] U.S. Cl. ................................................... 341/144
[58] Field of Search .................... 341/120, 144, 341/152

[56] References Cited

U.S. PATENT DOCUMENTS

| 4,340,856 | 7/1982 | Orlandi | 341/120 |
| 5,631,649 | 5/1997 | Nakamura | 341/144 |
| 5,712,633 | 1/1998 | Bae | 341/120 |

FOREIGN PATENT DOCUMENTS

| 4-360418 | 12/1992 | Japan . |
| 6-45935 | 2/1994 | Japan . |
| 6-152412 | 5/1994 | Japan . |
| 6-258402 | 9/1994 | Japan . |

*Primary Examiner*—Michael Tokar
*Assistant Examiner*—Auh Tran
*Attorney, Agent, or Firm*—Burns, Doane, Swecker & Mathis, LLP

[57] ABSTRACT

A D/A-converter-built-in integrated circuit which is provided with counter responsive to a count mode switching signal to switch between a count mode of repeating a count-up operation and a count mode of repeating a count-down operation, a D/A converter for converting a digital signal to analog form, and control means which, when supplied with a test enable signal for starting a test, causes the counter to start its counting and a selector to select and output a digital signal from the counter and then outputs the count mode switching signal to switch the count mode from the one to the other.

5 Claims, 12 Drawing Sheets

| M | Q | $\overline{Q}$ | Fout |
|---|---|---|---|
| H | L | H | L |
| H | H | L | H |
| L | L | H | H |
| L | H | L | L |

INTEGRATED CIRCUIT WITH A BUILT-IN D/A CONVERTER

BACKGROUND OF THE INVENTION

1. Field of the Invention

The present invention relates to an integrated circuit such as a D/A-converter-built-in LSI with analog and digital elements mixed therein and, more particularly, to a D/A converter-built-in integrated circuit that allows ease testing its D/A converter section.

2. Description of the Prior Art

Figure 10:
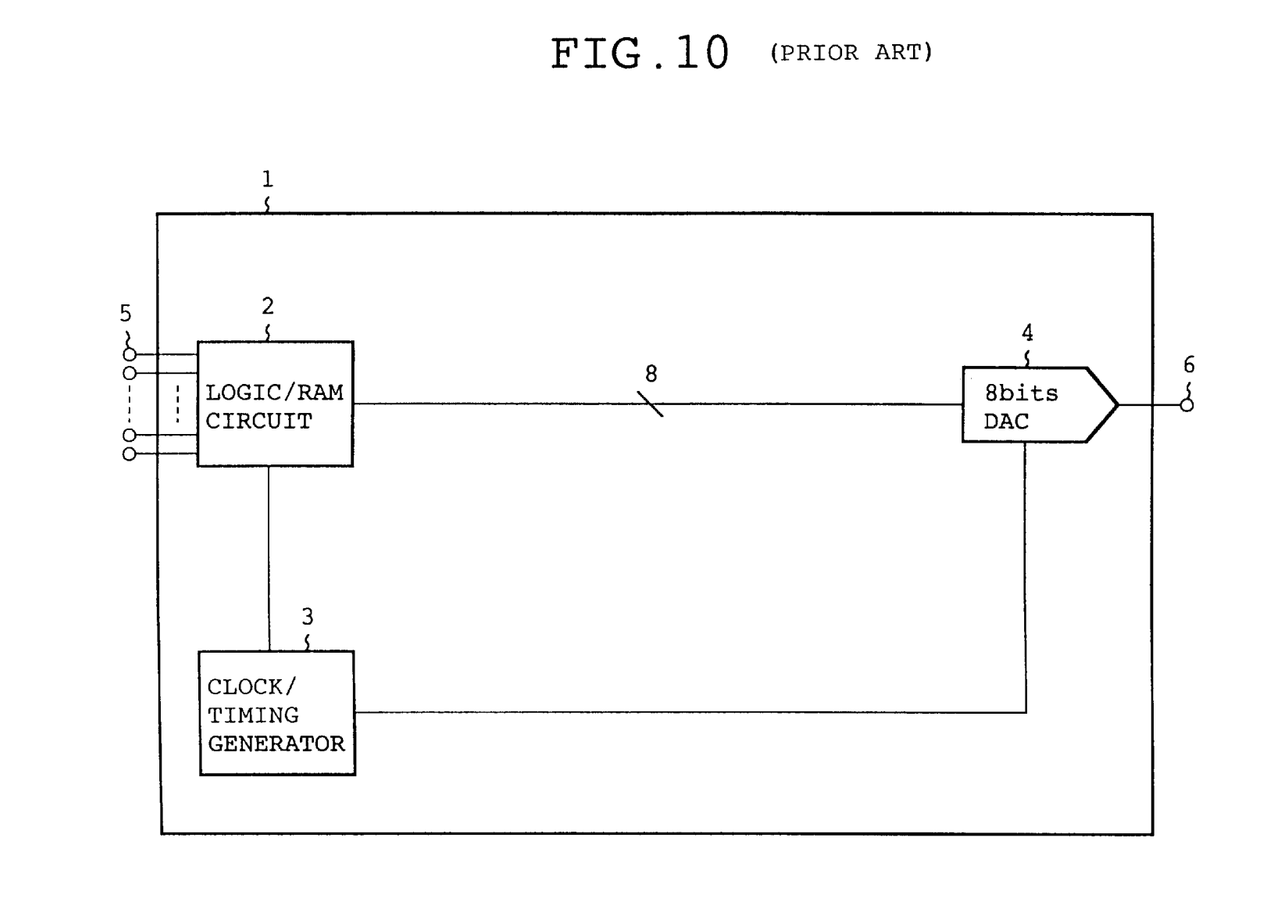
FIG. 10 is a block diagram showing the configuration of a conventional D/A-built-in LSI with analog and digital element mixed therein.

FIG. 10 illustrates in block form the configuration of a conventional D/A-converter-built-in LSI with analog and digital elements mixed therein. The LSI identified generally by 1 has a logic/RAM circuit 2, a clock/timing generator 3 for generating an internal clock of the LSI 1 and an 8-bit D/A converter (hereinafter abbreviated as a DAC) 4. The clock/timing generator 3 supplies the logic/RAM circuit 2 with a clock and the DAC 4 with a timing signal for D/A conversion. The LSI 1 has a large number of input terminals 5 and an analog output terminal 6.

In testing of the DAC 4 of the LSI 1, data is input via the digital I/O terminals 5 so that the DAC 4 outputs a signal of triangular or sawtooth waveform, and the waveform of the output signal from the analog output terminal 6 is converted from analog to digital form, thereafter being subjected to digital arithmetic processing to present test conclusions.

In Japanese Pat. Laid-Open Gazette No. 360418/92, there is disclosed a configuration in which either one of a digital input and the output from a synchronous counter having counted pulses generated by a pulse generator is selectively input into a digital-to-analog converter under the control of a linearity measurement control signal input to test it. In Japanese Pat. Laid-Open Gazette No. 45935/94 there is proposed a scheme of testing a D/A converter by selectively applying thereto either one of the output from a digital circuit and the output from a counter circuit. Similar techniques are disclosed in Japanese Pat. Laid-Open Gazettes Nos. 258402/94 and 152412/94 as well. With the apparatus disclosed in these gazettes, however, the linearity hysteresis cannot be tested because the counter used operates only in one direction; therefore, no accurate linearity test can be made.

The integrated circuit with a built-in D/A converter has such a construction as mentioned above, and hence it needs to be supplied with a relatively complex signal via a digital input terminal—this gives rise to a problem that the testing apparatus itself is inevitably complex and expensive. Additionally, it is difficult to conduct the hysteresis test with ease.

SUMMARY OF THE INVENTION

It is therefore an object of the present invention to provide an integrated circuit with a built-in D/A converter that permits easy testing of the hysteresis or the like of the DAC by a simple and inexpensive testing apparatus.

According to an aspect of the present invention, there is provided an integrated circuit with a built-in D/A converter which comprises: digital signal processing means for performing predetermined processing of a digital signal input thereto and for outputting a digital signal; clock digital generating means for generating clock signals; a counter for counting the clock signals generated by the clock signal generating means and outputting a digital signal representative of its count value, the counter being responsive to a count mode switching signal to switch between a count mode in which to repeat counting up the clock signals and a count mode in which to repeat counting down the clock signals; a selector responsive to a select signal to selectively output either one of the digital signal from the digital signal processing means and the digital signal from the counter; a D/A converter for converting the digital signal output from the selector to an analog signal; and control means which, when supplied with a test enable signal to start testing of the D/A counter, outputs a select signal for controlling the counter to start its counting operation and the selector to select and output the digital signal from the counter and, upon counting a predetermined number of clock signals, applies the count mode switching signal to the counter to switch it from one count mode to the other. The integrated circuit of such a configuration permits testing of the D/A converter without inputting complex signals from the outside and allows the use of a relatively low-speed testing apparatus even if the signal from the D/A converter is fast.

According to another aspect of the present invention, the control means of the integrated circuit with a built-in D/A converter is adapted so that, when the counter has counted a predetermined number of clock signals after switching from one count mode to the other, it sends a select signal to the selector to cause it to select and output the digital signal from the digital signal processing means. By this, it is possible to make a return to the normal mode without involving any particular operation, permitting simplification of the testing operation.

According to another aspect of the present invention, the control means of the integrated circuit with a built-in D/A converter is adapted to respond to the test enable signal to control the counter so that it repeats N (N being a natural number) cycles of counting in the one count mode and then N cycles of counting in the other count mode. By this, it is possible to output a sawtooth wave by up-counting and a sawtooth wave by down-counting in succession, allowing ease in testing the linearity hysteresis of the D/A converter.

According to another aspect of the present invention, there is provided an integrated circuit with a built-in D/A converter which comprises: digital signal processing means for performing predetermined processing of a digital signal input thereto and for outputting a digital signal; clock digital generating means for generating clock signals; a counter for successively repeating counting up and counting down the clock signals generated by the clock signal generating means, the counter outputting a digital signal representative of its count value; a selector responsive to a select signal to selectively output either one of the digital signal from the digital signal processing means and the digital signal from the counter; a D/A converter for converting the digital signal output from the selector to an analog signal; and control means which, when supplied with a test enable signal to start testing of the D/A counter, outputs a select signal for controlling the counter to start its counting operation and the selector to select and output the digital signal from the counter. The integrated circuit of such a configuration also permits testing of the D/A converter without inputting complex signals from the outside and allows the use of a relatively low-speed testing apparatus even if the signal from the D/A converter is fast.

According to still another aspect of the present invention, the control means is adapted so that, when the counter has repeatedly counted up and counted down the clock signals from the clock signal generating means a predetermined number of times, it sends a select signal to the selector to cause it to select and output the digital signal from the digital signal processing means. By this, it is possible to output plural triangular waves in succession, allowing ease in testing the linearity hysteresis of the D/A converter.

DESCRIPTION OF THE PREFERRED EMBODIMENTS

An embodiment of the present invention will hereinafter be described in detail with reference to the accompanying drawing.

[Embodiment 1]

Figure 1:
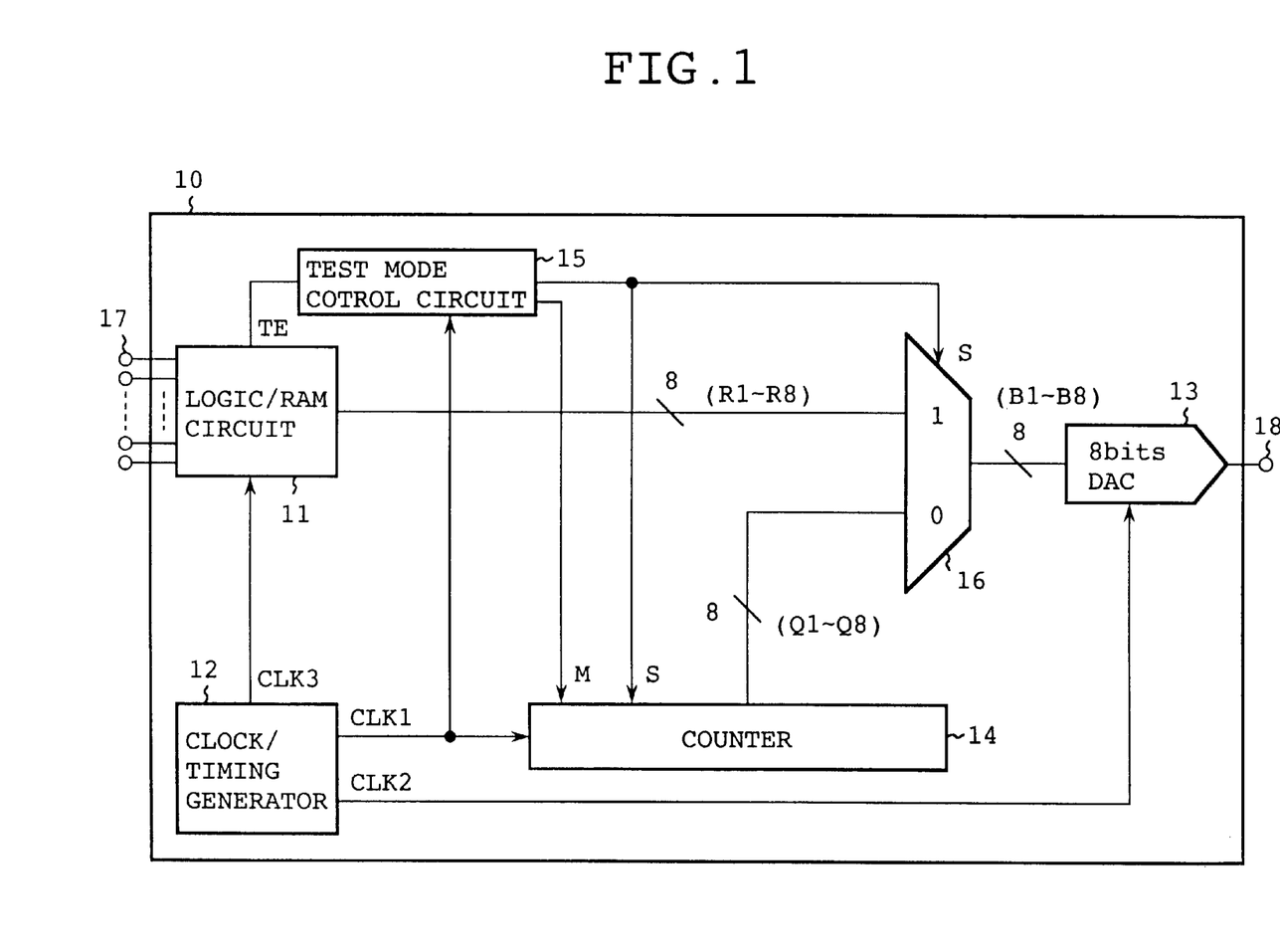
FIG. 1 is a block diagram illustrating the configuration of an LSI with a built-in D/A converter according to Embodiment 1 of the present invention.

FIG. 1 illustrates in block form the configuration of an LSI with a built-in D/A converter (an integrated circuit with a D/A converter) 10. The D/A converter will hereinafter be referred to as a DAC. In FIG. 1, reference numeral 11 denotes a logic/RAM circuit (digital signal processing means provided with a logic circuit and a RAM circuit), 12 a clock/timing generator (clock signal generating means) for supplying a clock and a predetermined timing signal to each part of the DAC-built-in LSI 10, 13 an 8-bit DAC (D/A converter), 14 an 8-bit counter that responds to a mode switching signal M to function as an up counter or down counter, 15 a test mode control circuit (control means) that responds to a test enable signal TE from the logic/RAM circuit 11 to control the operation of test mode, 16 a selector that operates under the control of the test mode control circuit 15 to supply the DAC 13 with signals R1~R8 from the logic/RAM circuit 11 in a normal mode and outputs Q1~Q8 from the counter 14 in the test mode, 17 a number of input terminals through which digital signals are input into the logic/RAM circuit 11, and 18 an output terminal at which an analog signal is provided from the DAC 13. The clock/timing generator 12 supplies a clock CLK1 to the counter 14, a clock CLK2 to the DAC 13 and a clock CLK3 to the logic/RAM circuit 11.

Figure 2:
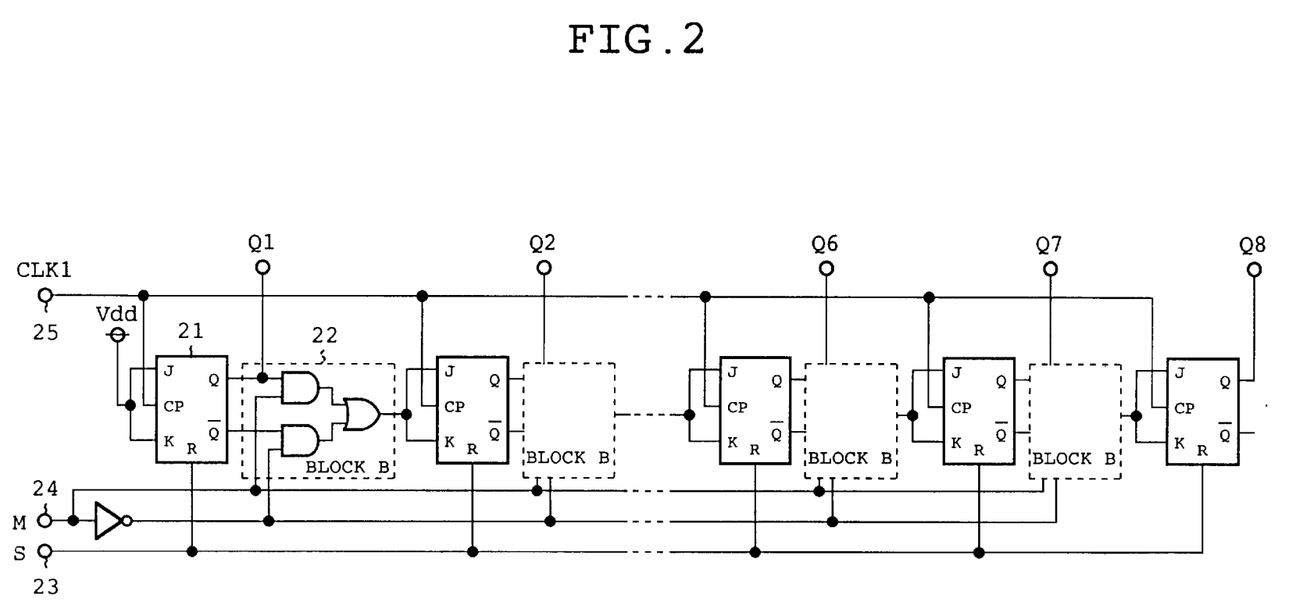
FIG. 2 is a circuit diagram showing the configuration of a counter in FIG. 1.

FIG. 2 is a circuit diagram showing the configuration of the counter 14. In FIG. 2, reference numeral 21 denotes JK flip-flops and 22 up-down switching circuits. The flip-flops 21 are reset upon application of a high-level (hereinafter abbreviated as "H") signal to a rest terminal 23 and released upon application thereto of a low-level (hereinafter abbreviated as "L") signal. The counter 14 is adapted to function as a up counter upon application of an "H" signal to a mode terminal 24 and as a down counter upon application thereto of a "L" signal. The clock signal CLK1 is applied to an input terminal 25.

Figure 3:
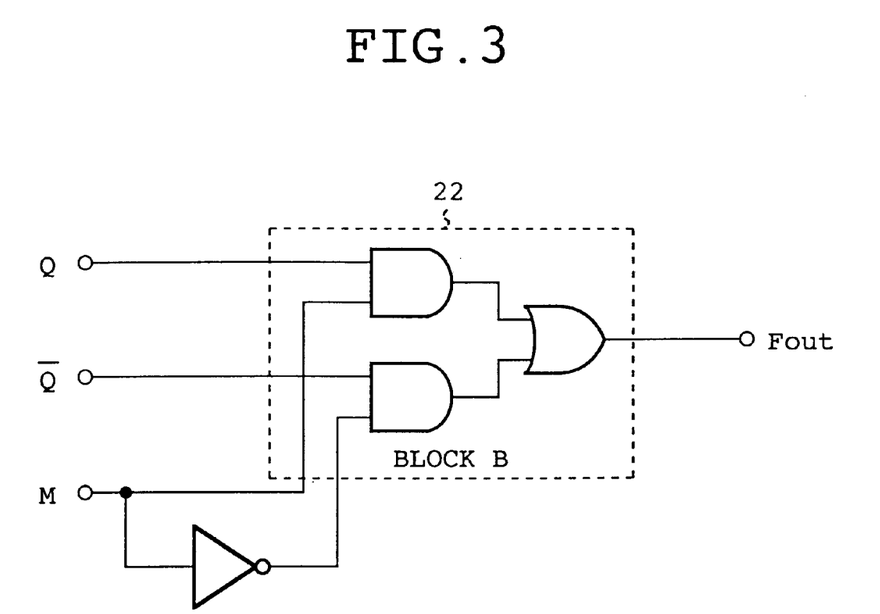
FIG. 3 is a circuit diagram showing the configuration of an up-down switching circuit in FIG. 2.
Figure 4:
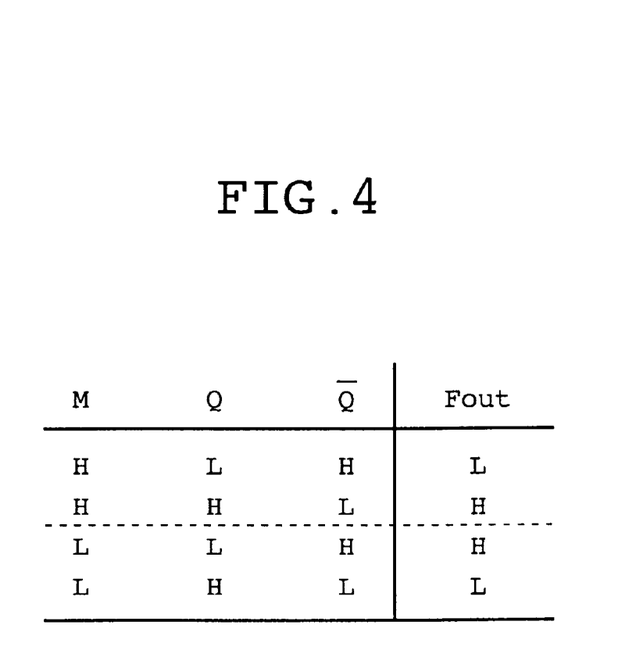
FIG. 4 is a table showing truth values of input and output signals of the up-down switching circuit depicted in FIG. 3.

FIG. 3 is a circuit diagram illustrating the configuration of each up-down switching circuit 22 in FIG. 2. As shown, the up-down switching circuit 22 is composed of two AND gates and an OR gate, and the circuit receives an output signal Q from the flip-flop 21 of the preceding stage and an inverted signal $\overline{Q}$ and outputs a signal Fout. FIG. 4 is a table showing truth values of the mode signal M, the signals Q and $\overline{Q}$ and the output signal Fout. As seen from FIG. 4, when the "H" signal is applied to the mode terminal 24, the signal Q is selected as the output signal and when the "L" signal is applied, the inverted signal $\overline{Q}$ is selected. And the counter depicted in FIG. 2 is so configured as to count up or down the clock CLK1, depending on the signal level at the mode terminal 24.

The LSI 10 shown in FIG. 1 has a normal mode of operation and a test mode. The normal mode of operation will be described first. During power-up the LSI 10 is in the normal mode. That is, the test mode control circuit 15 applies an "H" select signal S to each of the counter 14 and the selector 16. In this instance, the counter is in its reset state and the selector 16 selects the output signals R1~R8 from the logic/RAM circuit 11 and provides them as output signals B1~B8 to the DAC 13. That is, based on tile output signals R1~R8 from the logic/RAM circuit 11, the DAC 13 performs a D/A conversion and provides the analog signal to the output terminal 18.

Next, the test mode will be described. Upon application of a predetermined signal pattern via the digital input terminals 17 during operation in the normal mode, the logic/RAM circuit 11 outputs the test enable signal TE that starts up the test mode. When supplied with the test mode enable signal TE, the test mode control circuit 15 makes first the mode signal M high-level ("H") and then the select signal S low-level ("L"). When the select signal S becomes low-level, the counter 14 begins its count-up operation. Every 256 shots of the clock signal CLK1 from the clock/timing generator 12 the counter 14 finishes one cycle of counting-up operation and produces the digital signals Q1~Q8. The thus generated output signals Q1~Q8 are selected by the selector 16, from which a selected one of them is applied to the DAC 13. The DAC 13 converts the digital signal to an analog signal and outputs a sawtooth wave by the count-up operation every 256 clocks.

When the DAC 13 outputs 10 sawtooth waves, that is, when the counter 14 counts 2560 shots of the clock signal CLK1, the test mode control signal changes the mode signal M from the high to the low level. In consequence, the counter 14 similarly counts down 256 shots of the clock signal CLK1 and produces the digital signals Q1~Q8. The output digital signals are fed to the selector 16, from which they are selectively fed to the DAC 13, which, in turn, converts them to analog form and outputs a sawtooth wave by the count-down operation every 256 clocks.

Upon detecting 5120 shots of the clock signal CLK1, the test mode control circuit 15 changes the select signal from the low to the high level. That is, the normal mode of operation changes to the test mode.

Figure 5:
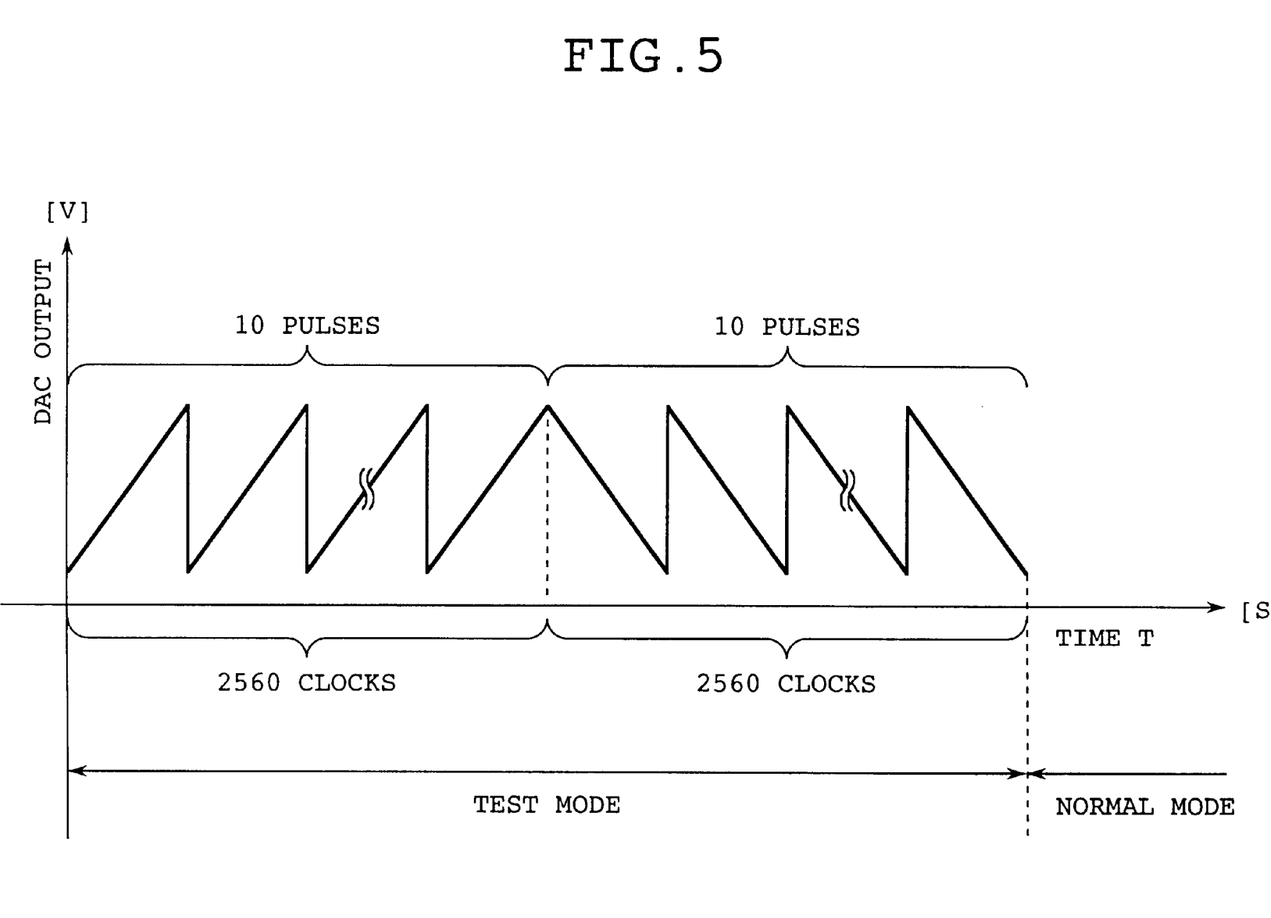
FIG. 5 is a diagram showing a waveform that is output from an analog terminal through the operation of Embodiment 1.

FIG. 5 is a diagram showing the waveform that is provided at the output terminal 18 by a series of operations described above. As shown, the test mode starts with the production of 10 pulses of sawtooth waveform by the count-up operation and ends with the production of 10 pulses of sawtooth waveform by the count-down operation, thereafter changing to the normal mode.

Incidentally, the signal from the output terminal 18 is A/D converted by an LSI tester or the like (not shown) and subjected to digital signal processing. In this signal processing the linearity test is conducted at the leading or trailing edge of the sawtooth wave. Further, by performing digital signal processing at the leading edges of the sawtooth waves by the count-up and count-down operations separately of each other, the linearity hysteresis test is carried out.

Figure 11:
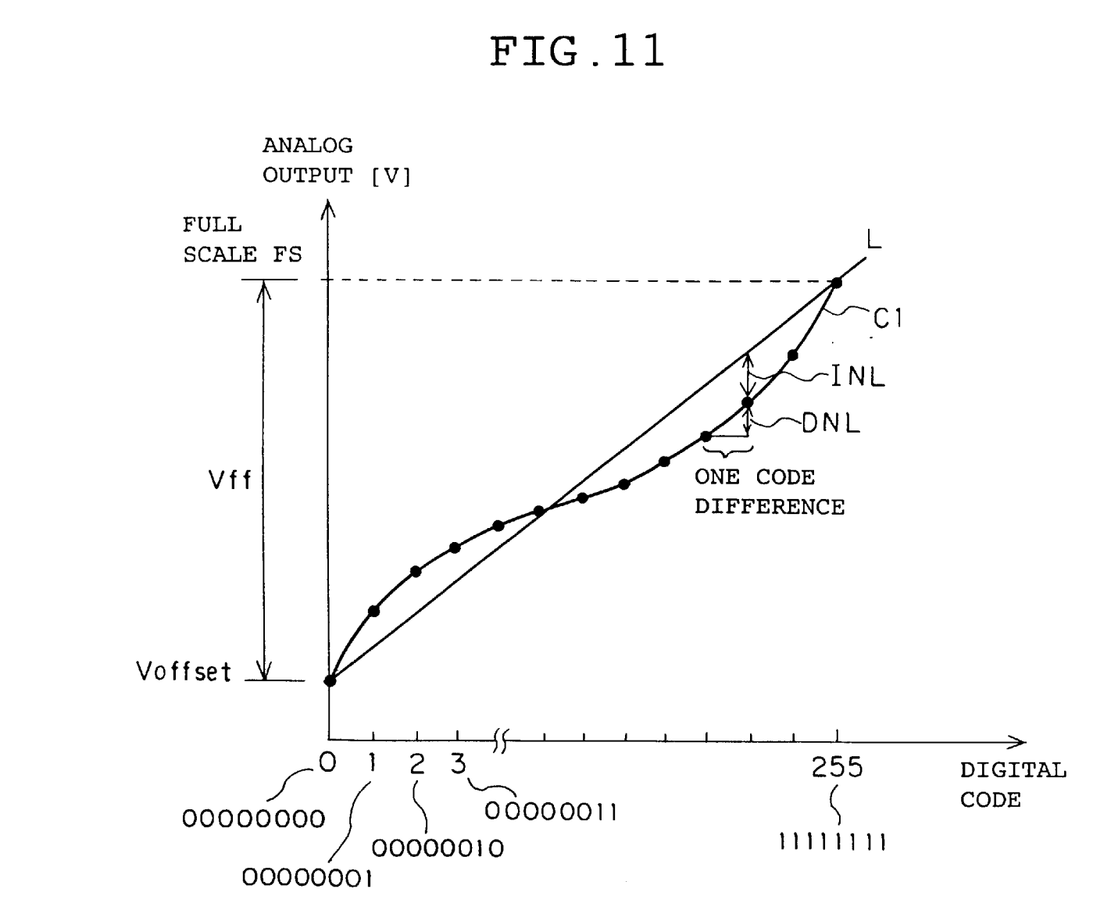
FIG. 11 is a graph showing an analog output signal from the D/A converter and an ideal straight line.

FIG. 11 is a graph showing an analog output signal C1 from the DAC 13 and an ideal straight line L. The abscissa represents the digital code value and the ordinate the analog output from the DAC 13. The analog output value corresponding to a digital code value 0 is Voffset, whereas the analog output value corresponding to a digital code value 255 is full scale FS (or maximum); the difference between these values is Vff. In this instance, one LSB Vff/255. In this graph, INL indicates integral nonlinearity errors representative of a deviation from the ideal straight line L and DNL differential nonlinearity errors representative of a deviation from the immediately preceding code value. In general, linearity tests fall into those based on the INL and those based on the DNL.

Figure 12:
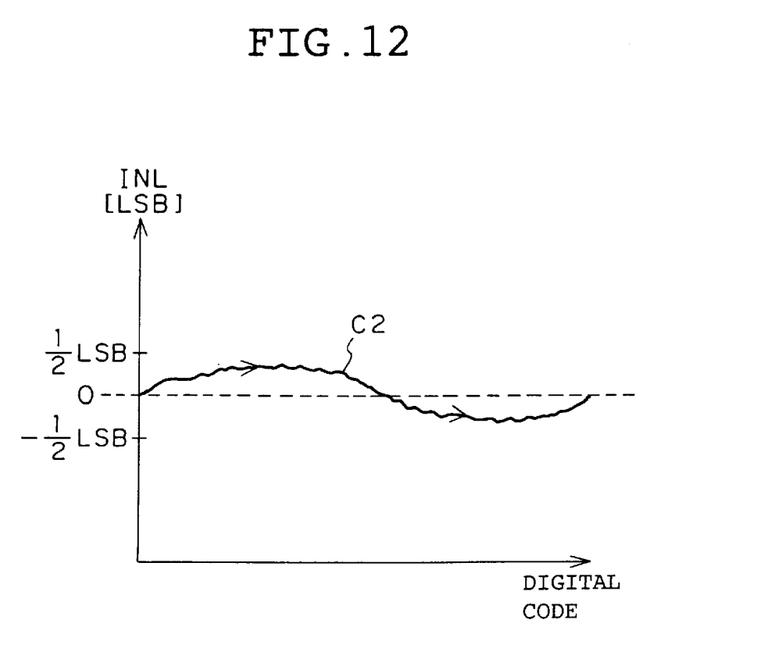
FIG. 12 is a graph showing integral nonlinearity errors (INL) plotted for each digital code.
Figure 13:
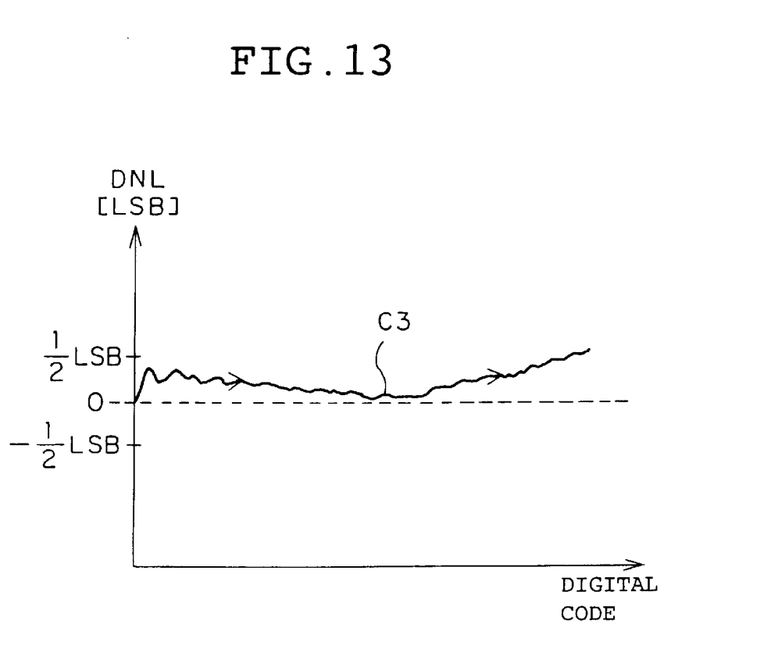
FIG. 13 is a graph showing differential nonlinearity errors (DNL) plotted for each digital code.

FIG. 12 is a graph plotting the INL for each digital code. It is customary in the art to use a maximum value of the absolute value of the curve C2 to decide whether the linearity is good or bad. FIG. 13 is a graph plotting the DNL for each digital code. In this case, too, a maximum value of the absolute value of the curve 13 is used to decide whether the linearity is good or bad.

Figure 14:
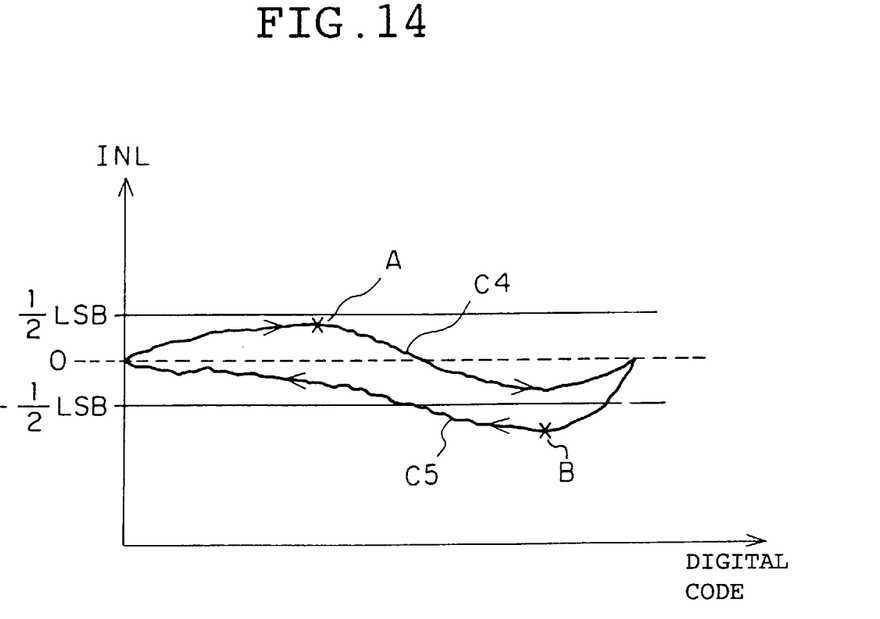
FIG. 14 is a graph showing the integral nonlinearity error (INL) in a linearity hysteresis test.

FIG. 14 is a graph showing a hysteresis test of the INL (integral nonlinearity errors) that can be done by this embodiment. As shown, the digital code is increased from 0 to 255 and then decreased from 255 to 0. At this time, the curve C4 is plotted first and then the curve C5 is plotted. The absolute value of the curve C4 is the value of the point A but the absolute value of the curve C5 is at the point B and hence is larger than the former; therefore, it is decided on the basis of the point B whether the INL is good or bad.

Figure 15:
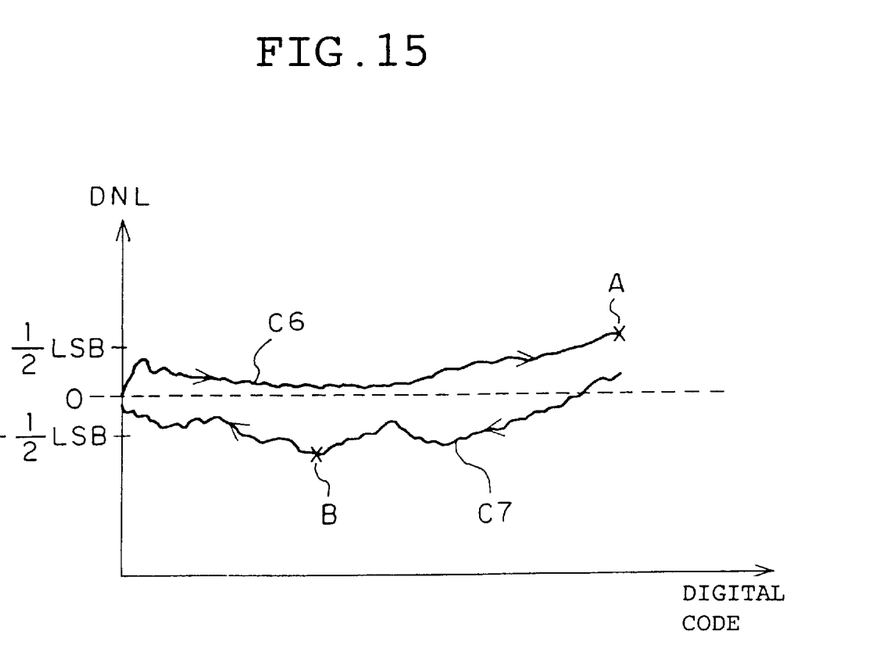
FIG. 15 is a graph showing the differential nonlinearity error (DNL) in the linearity hysteresis test.

FIG. 15 is a graph showing a hysteresis test of the DNL (differential nonlinearity errors) that can be done by this embodiment. As shown, the digital code is increased from 0 to 255 and then decreased from 255 to 0. At this time, the curve C6 is plotted first and then the curve C7 is plotted. The absolute value of the curve C6 is the value of the point A but the absolute value of the curve C7 is at the point B and hence is larger than the former; therefore, it is decided on the basis of the point B whether the DNL is good or bad.

Since a check is made to see if the linearity is good or bad, taking into account its variations in the case of decreasing the digital code from 255 to 0 as well as in the case of increasing it from 0 to 255 as described above, it is possible to provide increased accuracy in the linearity test.

According to this embodiment, sawtooth waves of the same waveforms are output in groups of 10 and in the case of sampling at 10 sample points, for instance, it is possible to perform first sampling by a first sawtooth pulse, second sampling by a second sawtooth pulse and i-th sampling by an i-th sawtooth pulse even if the 10 sawtooth waves are fast—this permits the use of an LSI tester of relatively low-speed operation. Further, since the LSI automatically leaves the test mode and reenters the normal mode after outputting the required waveforms as predetermined, there is no need of inputting any particular signal into the LSI to return it to the normal mode.

While the above embodiment has been described to successively output 10 sawtooth waves by the count-up operation and 10 sawtooth waves by the count-down operation, the number "10" is merely illustrative and a natural number N can be chosen in general. In such an instance, it is necessary that the number of clocks CLK1 to be counted by the test mode control circuit 15 be determined based on the number N being chosen.

Figure 6:
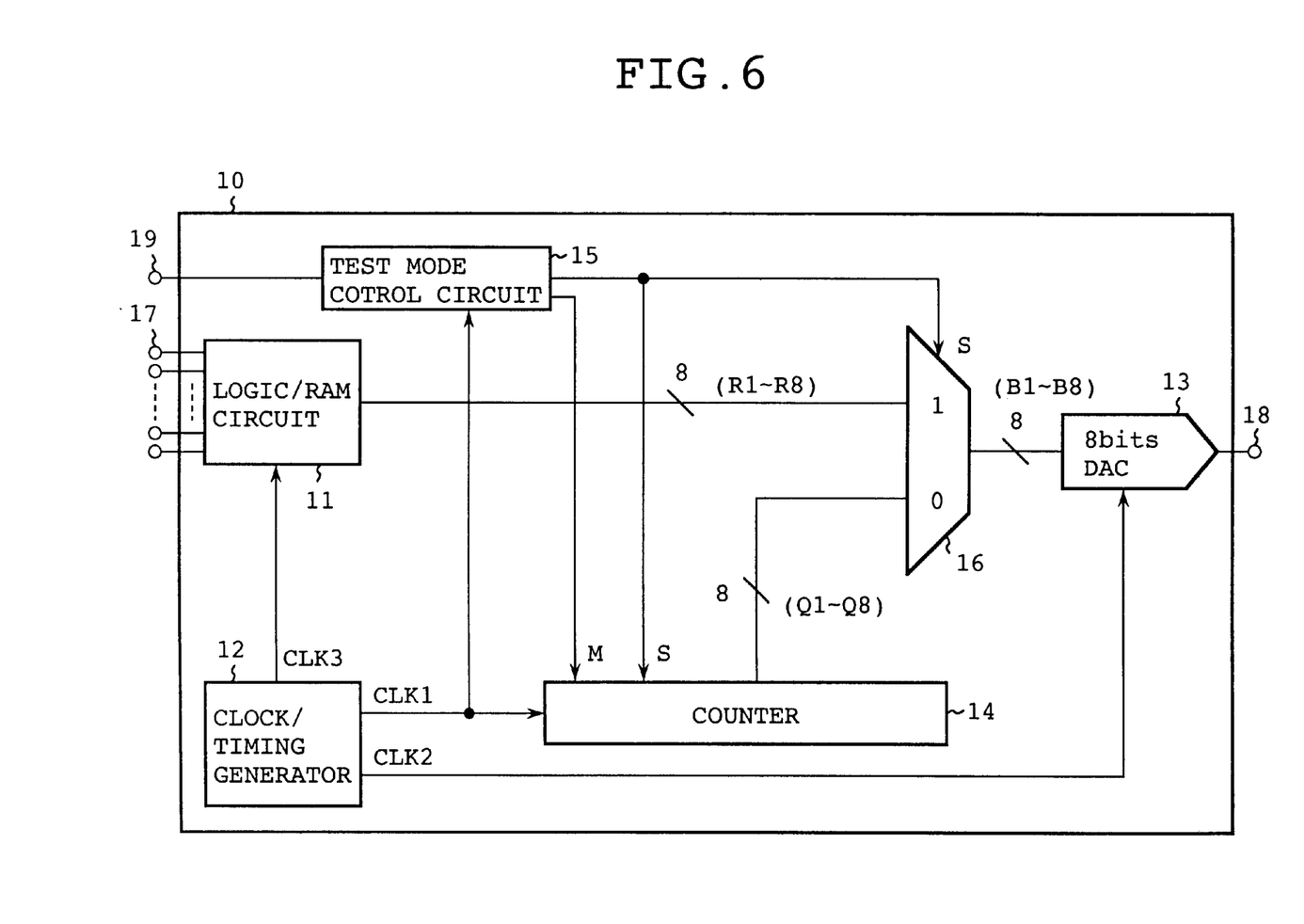
FIG. 6 is a block diagram illustrating a modified form of Embodiment 1 wherein an input terminal is newly provided to directly input therethrough a test enable signal from the outside.

Moreover, although in FIG. 1 the logic/RAM circuit 11 is shown to apply the test enable signal TE to the test mode control circuit 15, it is also possible to provide an input terminal 19 through which the test enable signal TE is fed to the test mode control circuit 15 directly from the outside as shown in FIG. 6. This increases the number of external terminals but eliminates the necessity of decoding the signal from the input terminal 17 in the logic/RAM circuit 11, hence permitting simplification of its construction.

[Embodiment 2]

Figure 7:
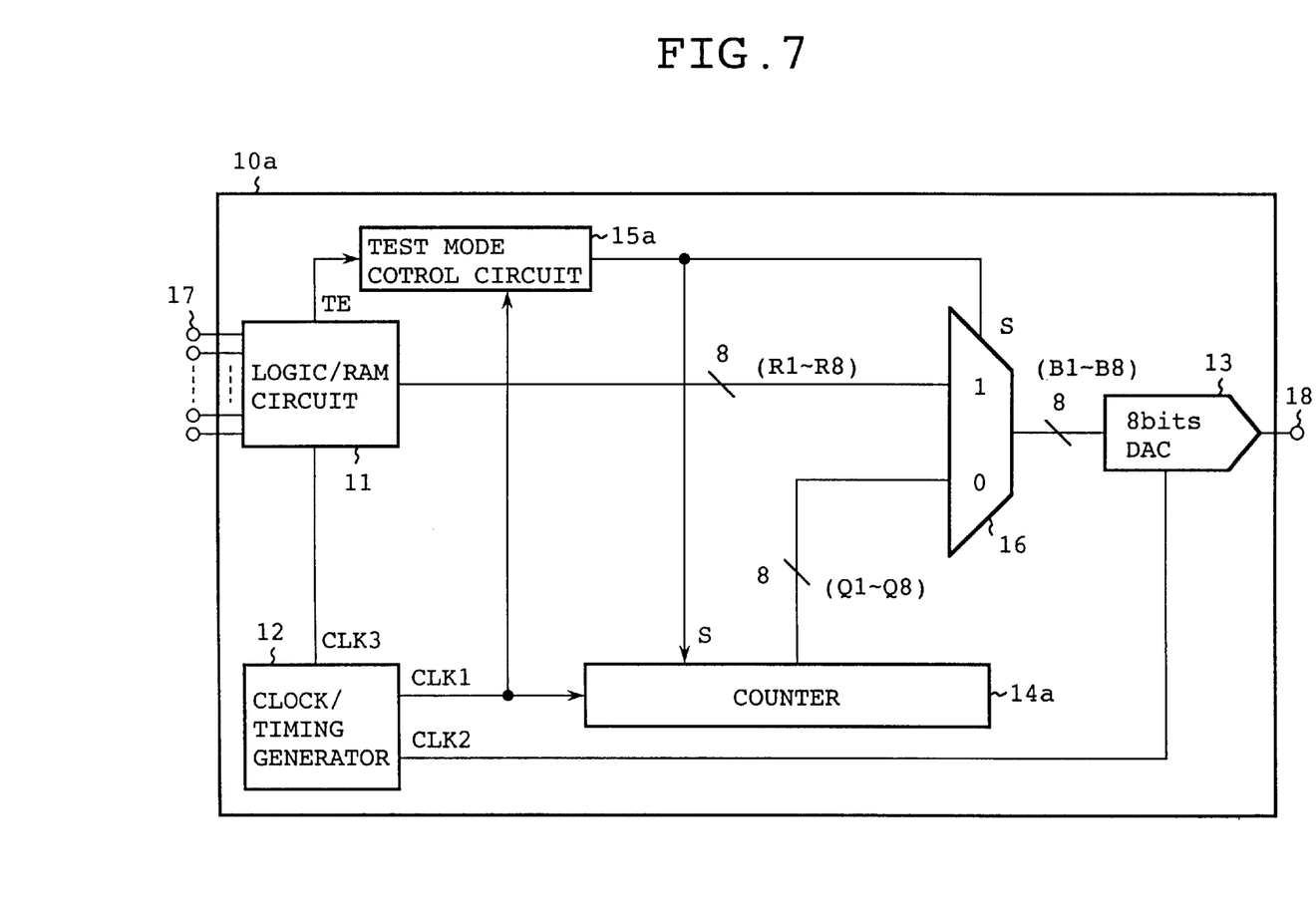
FIG. 7 is a block diagram illustrating the configuration of an LSI with a built-in D/A converter according to Embodiment 2 of the present invention.

FIG. 7 illustrates in block form the configuration of a DAC-built-in LSI 10a according to Embodiment 2 of the present invention. The part corresponding to those in FIG. 1 are identified by the same reference numerals and no description will be repeated concerning them. A counter 14a in this embodiment successively counts up and counts down the clock pulses CLK1 from the clock/timing generator 12 and applies the digital signals Q1~Q8 to the selector 16.

Figure 8:
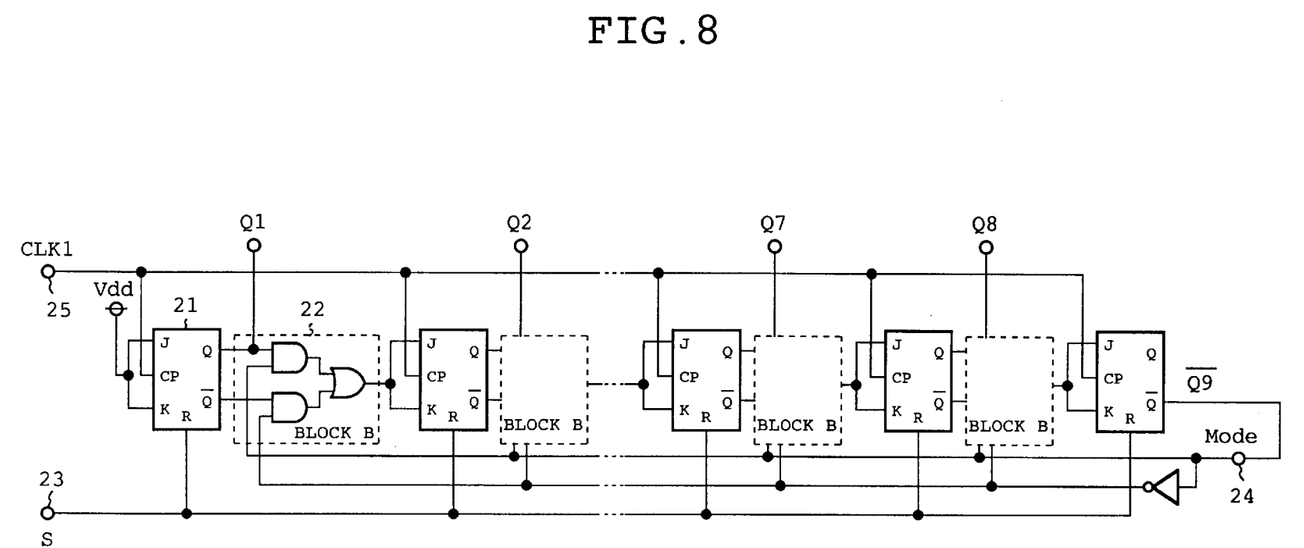
FIG. 8 is a circuit diagram showing a detailed configuration of a counter in FIG. 7.

FIG. 8 is a detailed circuit diagram of the counter 14a. The parts corresponding to those in FIG. 2 are identified by the same reference numerals and no description will be repeated concerning them. The counter 14a has a JK flip-flop at a ninth bit and applies an inverted version of its output signal Q to the mode terminal 24. On this account, the counter 14a performs the count-up and the count-down operation alternately with each other and, upon each counting of 512 clock pulses CLK1, carries out one cycle of count-up and count-down operations.

When supplied with the test enable signal TE from the logic/RAM circuit 11 in the normal mode, a test mode control circuit (control means) 15a changes the select signal S from the high to the low level, the select signal S being fed to the counter 14a and the selector 16. In consequence, the counter 14a performs the count operation accordingly and the digital signal from the counter 14a is fed via the selector 16 to the DAC 13. Having counted 5120 clock pulses CLK1, that is, having counted 10 cycles of count-up and count-down operations, the test mode control circuit 15a make the low-level select signal S high-level. As a result, the LSI 10a shown in FIG. 7 enters the normal mode and the output signals R1~R8 from the logic/RAM circuit 11 are provided to the DAC 13.

Figure 9:
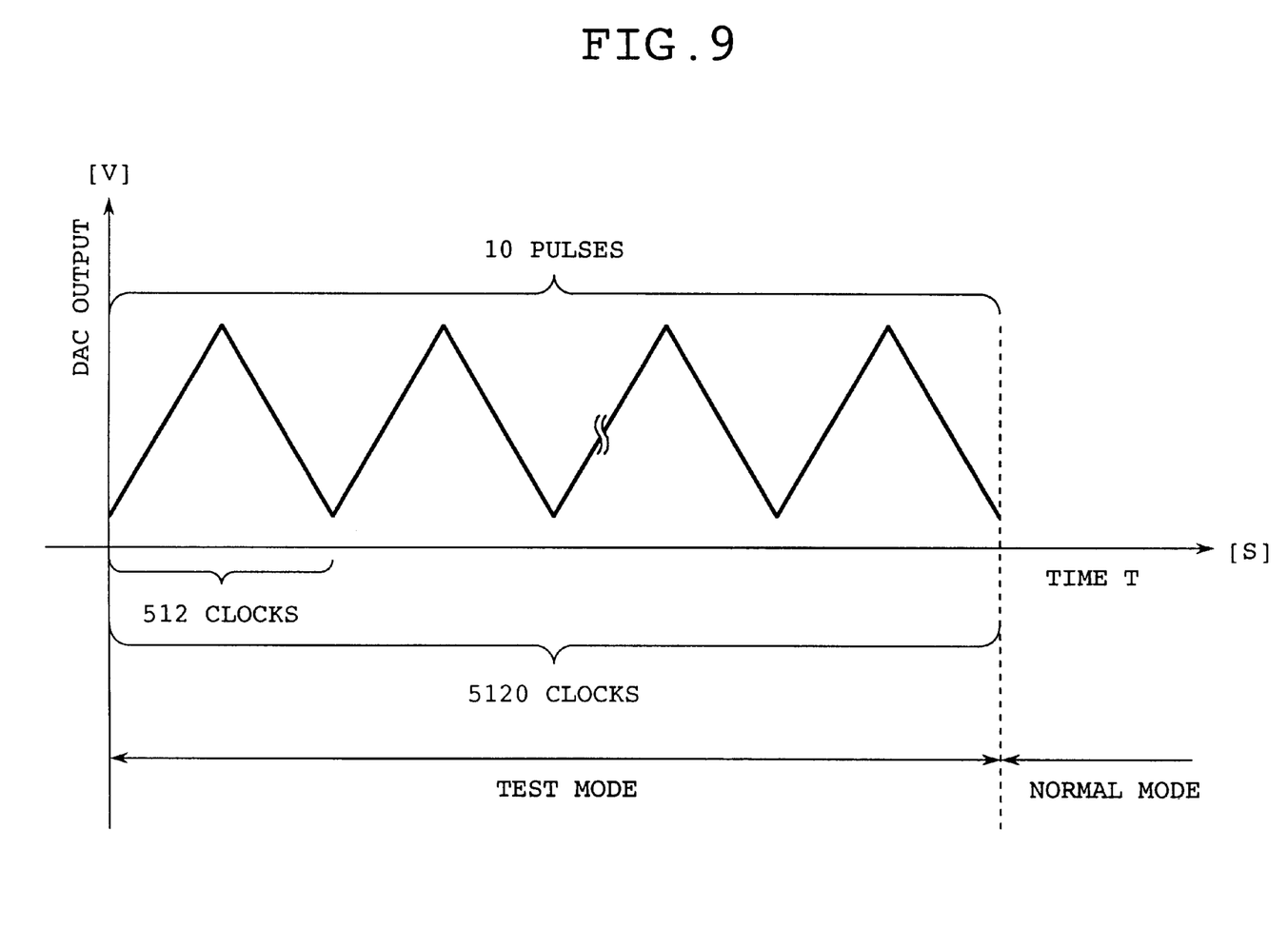
FIG. 9 is a diagram showing a waveform that is output from an analog terminal in Embodiment 2.

FIG. 9 is a diagram showing the waveform that is provided to the output terminal 18 by the above-described operations in this embodiment. As shown, the test mode changes to the normal mode after production of 10 triangular pulses.

Incidentally, as is the case with Embodiment 1, the signal from the output terminal 18 is A/D converted by an LSI tester or the like (not shown) and subjected to digital signal processing. In this signal processing the linearity test is conducted at the leading or trailing edge of the triangular wave. Further, by performing digital signal processing at the leading and trailing edges of the triangular waves separately of each other, the linearity hysteresis test is carried out.

According to this embodiment, triangular waves of the same waveforms are output in groups of 10 and in the case of sampling at 10 sample points, for instance, it is possible to perform first sampling by a first triangular pulse, second sampling by a second triangular pulse and i-th sampling by an i-th triangular pulse even if the 10 triangular waves are fast—this permits the use of an LSI tester of relatively low-speed operation. Further, since the LSI 10a automatically leaves the test mode and reenters the normal mode after outputting the required waveforms as predetermined, there is no need of inputting any particular signal into the LSI to return it to the normal mode.

While the above embodiment has been described to successively output 10 triangular waves, the number "10" is merely illustrative and a natural number N can be chosen in general. In such an instance, it is necessary that the number of clock pulses CLK1 to be counted by the test mode control circuit 15a be determined based on the number N being chosen.

Moreover, although in FIG. 7 the logic/RAM circuit 11 is shown to apply the test enable signal TE to the test mode control circuit 15a, it is also possible to provide an input terminal 19 through which the test enable signal TE is fed to the test mode control circuit 15a directly from the outside as described previously with respect to FIG. 6. This increases the number of external terminals but eliminates the necessity of decoding the signal from the input terminal 17 in the logic/RAM circuit 11, hence permitting simplification of its construction.

It will be apparent that many modifications and variations may be effected without departing from the scope of the novel concepts of the present invention.

What is claimed is:

1. An integrated circuit with a built-in D/A converter, comprising:

digital signal processing means for performing predetermined processing of a digital signal input thereto and for outputting a digital signal;

clock signal generating means for generating clock signals;

a counter for counting said clock signals generated by said clock signal generating means and outputting a digital signal representative of its count value, said counter being responsive to a count mode switching signal to switch between a count mode in which to repeat counting up said clock signals and a count mode in which to repeat counting down said clock signals;

a selector responsive to a select signal to selectively output either one of said digital signal from said digital signal processing means and said digital signal from said counter;

a D/A converter for converting said digital signal output from said selector to an analog signal; and control means which, when supplied with a test enable signal to start testing of said D/A converter, outputs a select signal for controlling said counter to start its counting operation and said selector to select and output said digital signal from said counter and, upon counting a predetermined number of clock signals, applies said count mode switching signal to said counter to switch it from one count mode to the other.

2. The circuit according to claim 1, wherein when said counter has counted a predetermined number of clock signals after switching from one count mode to the other, said control means sends a select signal to said selector to cause it to select and output said digital signal from said digital signal processing means.

3. The circuit according to claim 2, wherein said control means responds to said test enable signal to repeat N (N being a natural number) cycles of counting in the one count mode and then N cycles of counting in the other count mode.

4. An integrated circuit with a built-in D/A converter comprising:

digital signal processing means for performing predetermined processing of a digital signal input thereto and for outputting a digital signal;

digital clock generating means for generating clock signals;

a counter for successively repeating counting up and counting down said clock signals generated by said clock signal generating means, said counter outputting a digital signal representative of its count value;

a selector responsive to a select signal to selectively output either one of said digital signal from said digital signal processing means and said digital signal from said counter;

a D/A converter for converting said digital signal output from said selector to an analog signal;

and control means which, when supplied with a test enable signal to start testing of said D/A converter, outputs a select signal for controlling said counter to start its counting operation and said selector to select and output said digital signal from said counter.

5. The circuit according to claim 4, wherein when said counter has repeated count-up and count-down operations a predetermined number of times, said control means sends a select signal to said selector to cause it to select and output said digital signal output from said digital signal processing means.

* * * * *